United States Patent
Hsu et al.

(10) Patent No.: US 11,573,759 B2
(45) Date of Patent: Feb. 7, 2023

(54) ELECTRONIC DEVICE HAVING DISPLAY PANEL AND FLEXIBLE SUBSTRATE

(71) Applicant: InnoLux Corporation, Miao-Li County (TW)

(72) Inventors: Yi-Hua Hsu, Miao-Li County (TW); Ker-Yih Kao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 25 days.

(21) Appl. No.: 17/378,964

(22) Filed: Jul. 19, 2021

(65) Prior Publication Data

US 2021/0342113 A1 Nov. 4, 2021

Related U.S. Application Data

(63) Continuation of application No. 16/407,398, filed on May 9, 2019, now Pat. No. 11,094,775.

(60) Provisional application No. 62/685,286, filed on Jun. 15, 2018.

(30) Foreign Application Priority Data

Nov. 27, 2018 (CN) .......................... 201811431648.9

(51) Int. Cl.
*H01L 29/08* (2006.01)
*G06F 3/14* (2006.01)
*H01L 27/32* (2006.01)
*H01L 51/00* (2006.01)

(52) U.S. Cl.
CPC ........ *G06F 3/1446* (2013.01); *H01L 27/3293* (2013.01); *H01L 51/0097* (2013.01); *G09G 2380/02* (2013.01); *H01L 2251/5338* (2013.01)

(58) Field of Classification Search
CPC ........................ H01L 27/3293; H01L 51/0097
See application file for complete search history.

(56) References Cited

U.S. PATENT DOCUMENTS 10,503,297 B2 * 12/2019 Zeng ..................... G06F 1/1626
10,575,403 B2 * 2/2020 Park ..................... H05K 1/0278

* cited by examiner

*Primary Examiner* — Caleb E Henry
(74) *Attorney, Agent, or Firm* — McClure, Qualey & Rodack, LLP

(57) ABSTRACT

A tiled electronic device includes a plurality of display panels, and at least one of the display panels includes a flexible substrate, a pixel, and two signal wires. The flexible substrate has a display portion and a bent portion connected to the display portion. The pixel is disposed on the display portion. The signal wires are disposed on the flexible substrate, and electrically connected to the pixel. Each of the signal wires has a first segment disposed on the display portion, and a second segment disposed on the bent portion. The two first sections have a first pitch, and the two second sections have a second pitch. The first pitch is different than the second pitch.

6 Claims, 10 Drawing Sheets

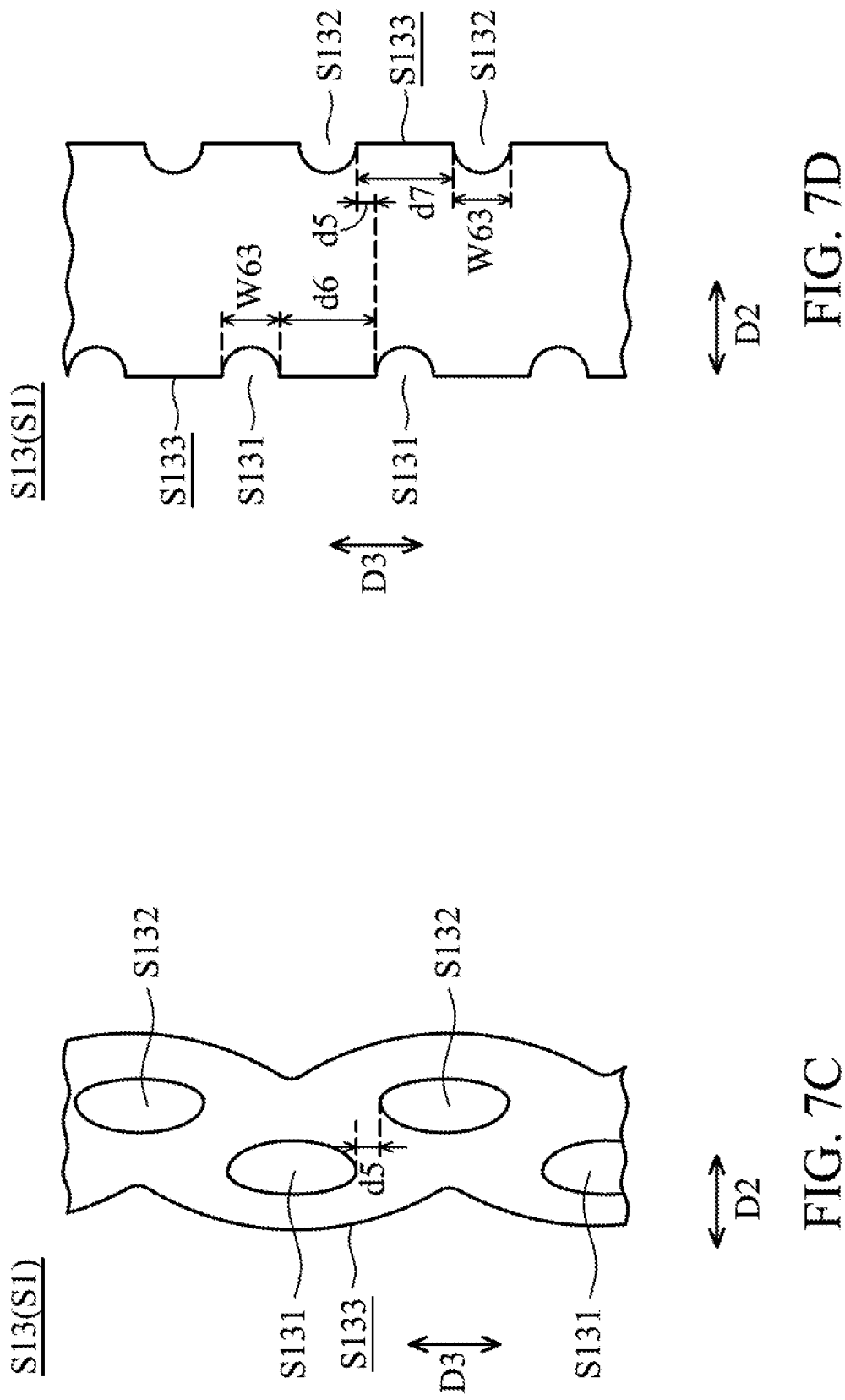

ELECTRONIC DEVICE HAVING DISPLAY PANEL AND FLEXIBLE SUBSTRATE

CROSS-REFERENCE TO RELATED APPLICATIONS

This application is a Continuation of application Ser. No. 16/407,398, filed May 9, 2019, which claims the benefit of U.S. Provisional Application No. 62/685,286, filed on Jun. 15, 2018, and China Patent Application No. 201811431648.9, filed on Nov. 27, 2018, the entirety of which are incorporated by reference herein.

BACKGROUND

Field of the Invention

The present disclosure relates to a tiled electronic device, and in particular to a tiled electronic device with a narrow frame.

Description of the Related Art

In recent years, display screens have been widely used to dynamically display advertisements. However, due to the size limitations of an operable display screen, it is difficult to display an advertisement over a large area using a single display screen.

In order to solve the above problem, in the prior art, a plurality of display screens are connected into one screen wall to display large-area advertisements. However, the display area of the display panel cannot cover the entire area of the display panel, and thus a frame is formed on the edge of the display panel. When the display panel is spliced, the image displayed on the screen wall will appear as a grid-like line, which affects the quality of the integral image of the screen wall.

Accordingly, while existing display panels have been generally adequate for their intended purposes, they have not been entirely satisfactory in all respects. Consequently, it would be desirable to provide a solution for improving the display panels.

BRIEF SUMMARY

A tiled electronic device includes a plurality of display panels, and at least one of the display panels includes a flexible substrate, a pixel, and two signal wires. The flexible substrate has a display portion and a bent portion connected to the display portion. The pixel is disposed on the display portion. The signal wires are disposed on the flexible substrate, and electrically connected to the pixel. Each of the signal wires has a first segment disposed on the display portion, and a second segment disposed on the bent portion. The two first sections have a first pitch, and the two second sections have a second pitch. The first pitch is different from the second pitch.

BRIEF DESCRIPTION OF THE DRAWINGS

The invention can be more fully understood by reading the subsequent detailed description and examples with references made to the accompanying drawings, wherein:

FIG. 7C is a top view of the second segment of the signal wire in accordance with a third embodiment of the present disclosure.

FIG. 7D is a top view of the second segment of the signal wire in accordance with a fourth embodiment of the present disclosure.

DETAILED DESCRIPTION

Figure 1:
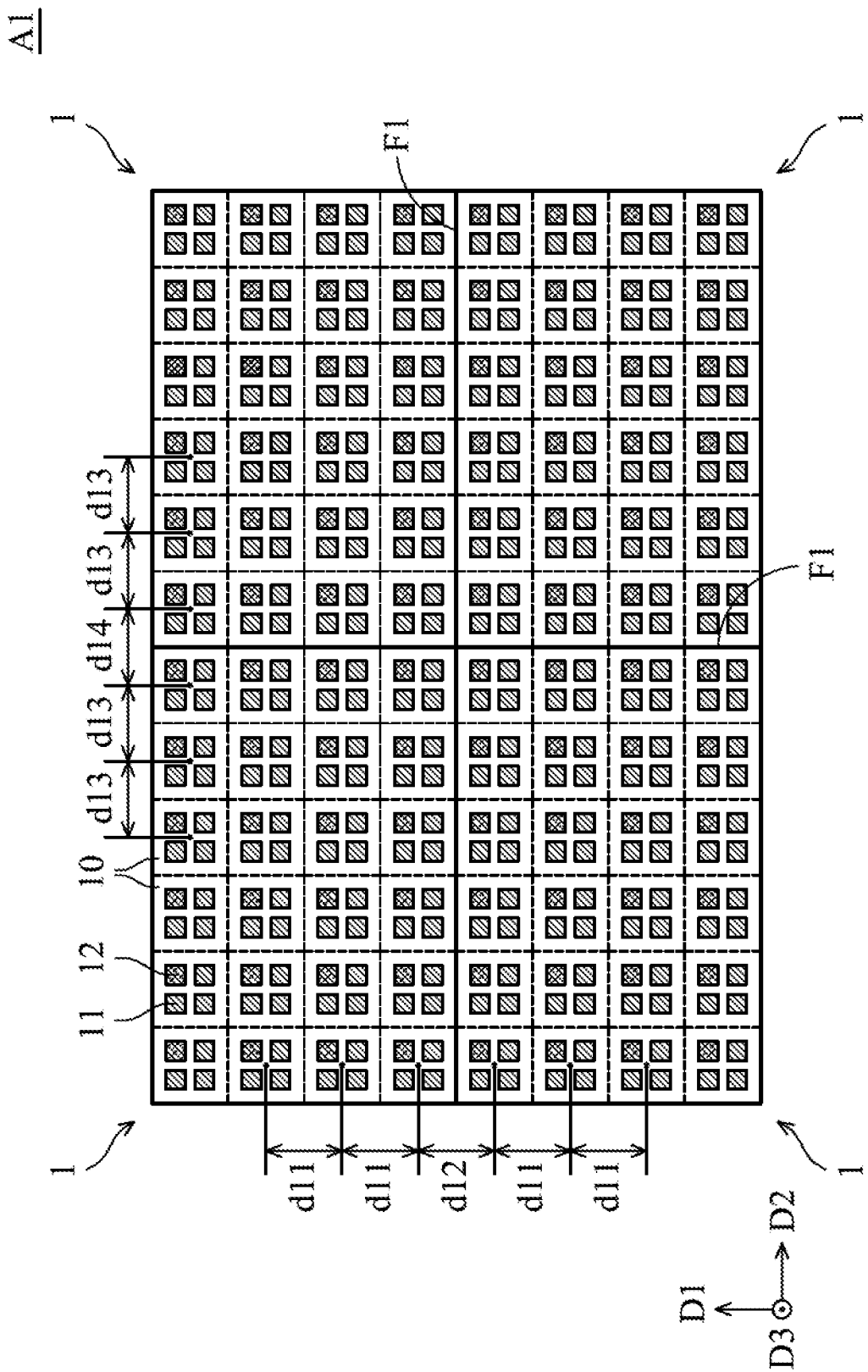
FIG. 1 is a schematic view of the tiled electronic device in accordance with a first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

The words, such as "first" or "second", in the specification are for the purpose of clarity of description only, and are not relative to the claims or meant to limit the scope of the claims. In addition, terms such as "first feature" and "second feature" do not indicate the same or different features.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. Moreover, the shape, size, thickness, and tilt angle depicted in the drawings may not be drawn to scale or may be simplified for clarity of discussion; these drawings are merely intended for illustration.

In the present disclosure, the term "electrically connected to" includes, unless otherwise defined, a direct connection, an indirect connection, and an electrical coupling.

In the present disclosure, the term "substantially" means the variation of the absolute value of the distance between the two is less than 10%.

In the present disclosure, the description "substantially parallel to each other" means that the absolute difference between the angles of the two is less than the variation within 5 degrees.

In the present disclosure, the descriptions, such as "disposed on", indicate the corresponding positional relationship between two elements, and the two elements may be in direct contact or there may be other layers between the two components instead of direct contact.

FIG. 1 is a schematic view of the tiled electronic device A1 in accordance with a first embodiment of the present disclosure. The tiled electronic device A1 includes display panels 1. The display panel 1 may be an organic light-emitting diode (OLED) panel, a quantum dot panel, a mini LED panel or a micro LED panel structure, or a tiled panel assembled by different or the same type of the panel structures, but there are not limited there to. In the embodiment, the display panel 1 may be a LED panel. The display panel 1 may be arranged in an array on a plane. Each display panel 1 is configured to display an image. All the images displayed by display panels 1 can be spliced into an integral image.

In the embodiment, the tiled electronic device A1 has four display panels 1. However, the number of display panels 1 may be at least two, and the number of display panel 1 is not limited. In some embodiments, the number of display panel 1 may exceed 100. The size of the display panel 1 is greater than or equal to 5 inch and less than or equal to 100 inch, but it is not limited thereto.

In the embodiment, the sizes and the shapes of the display panels 1 may be the same. In some embodiments, the sizes and/or the shapes of the display panels 1 may be different. In the embodiment, the shapes of the display panel 1 may be rectangular. In some embodiments, the display panel 1 may be a polygon or an irregular shape. The polygon may be a triangle, a quadrilateral, a pentagon, a hexagon, or any suitable shape, but it is not limited thereto.

The display panel 1 includes pixels 10. The pixels 10 may be arranged in an array on a plane. Each pixel 10 is configured to display different colors. All pixels 10 may present an image. In the embodiment, the shapes of the pixels 10 may be the same. In the embodiment, the shape of the pixel 10 may be a square, a rectangle or an irregular shape, but it is not limited thereto. In one embodiment, each pixel 10 is disposed on a flexible substrate 20, and includes at least one light-unit electrode 11 and a common electrode (VSS) 12. The described embodiment is only an example and is not limited thereto.

For the purpose of clarity, there are 24 pixels 10 in one display panels 1. However, the number of pixels 10 is not limited. In some embodiments, the number of pixels 10 is in a range from 10,000 to 50,000. In some embodiments, the number of pixels 10 may exceed one 1,000 or 10,000.

In order to enable the integral image displayed by the tiled electronic device A1 to have a better image quality, the distance d11 between any two centers of adjacent pixels 10 arranged in an extension direction D1 are substantially the same. In one embodiment, if the pixel 10 includes three light-unit electrodes 11 and one common electrode 12. The connection lines, which are connected the geometric centers of the light-unit electrodes 11 and the geometric center of the common electrode 12, may form a polygonal area or an irregular area. The geometric center of the area formed by the connecting lines is defined as a pixel center.

The pixel 10 may include only one light-unit electrode 11 or only one common electrode 12. In another embodiment, if the pixel 10 includes only one light-unit electrode 11 and one common electrode 12, the connection line, which is connected the geometric center of the light-unit electrode 11 and the geometric center of the common electrode 12, has a center point. The center point is the pixel center.

The pixel 10 may not include the light-unit electrode 11 or may not include the common electrode 12. The described embodiment is only an example and is not limited thereto. The pixel 10 may include one single light-unit electrode 11 or include one single common electrode 12. The geometric center of the light-unit electrode 11 itself or the geometric center of the common electrode 12 itself is the pixel center. Moreover, in two adjacent display panels 1, the distance d12 between any two pixel centers of adjacent pixels 10 arranged in the extension direction D1 are substantially the same as the distance d11. Moreover, in one display panel 1, the distances d13 between any two pixel centers of adjacent pixels 10 arranged in an extension direction D2 are substantially the same. In one embodiment, the extension direction D2 may be perpendicular to the extension direction D1.

Moreover, in two adjacent display panels 1, the distances d14 between any two centers of adjacent pixels 10 arranged in the extension direction D2 are substantially the same as the distances d13. In the embodiment, the distances d11 and d12 are substantially the same as the distances d13 and d14 respectively. In some embodiments, the distances d11 and d12 are substantially different than the distances d13 and d14 respectively.

Accordingly, in the tiled electronic device A1 of the present disclosure, the pixels 10 may be filled with each display panel 1. Each display panel 1 may has a narrow frame F1. The integral image displayed by the tiled electronic device A1 can present a narrow boundary line, thereby improving the quality of the integral image.

In the embodiment, the light-unit electrodes 11 may be electrically connected to an electrode of LED (such as an anode or a cathode). The common electrodes 12 may be an electrically connected to the other electrode of LED (such as a cathode or an anode). After applying driving voltage or constant voltage to the light-unit electrodes 11 or the common electrodes 12, the light-emitting diode (LED) after the packaging process (not shown in figures) may be emitted with a specific color, such as red light, green light, white light or blue light, with a specific brightness. The pixels 10 may present in different colors or brightness by controlling the voltage of the different light-unit electrodes 11 or the voltage of the common electrode 12 in the pixel 10.

In one embodiment, the material of the flexible substrate 20 may be polyimide (PI), polyethylene terephthalate (PET) or another material that is suitable for use as a flexible substrate. The described embodiment is only an example and is not limited thereto.

The light-unit electrodes 11 and the common electrodes 12 may be arranged in an array in the pixel 10. In some embodiments, the pixel 10 may not include the common electrodes 12, and the common electrodes 12 are disposed on the opposite side of the flexible substrate 20, so as to form a vertical type of LED structure. In addition, the light-unit electrodes 11 are arranged in an array in the pixel 10.

In the embodiment, each pixel 10 includes three light-unit electrodes 11 and one common electrode 12. However, the number of light-unit electrodes 11 is not limited thereto. There may be at least one light-unit electrode 11. In some embodiments, there may be four, five, or six light-unit electrodes 11. In other embodiments, the light-unit electrodes 11 have different sizes or shapes. It depends on the requirements of the color balance of the display panel or the emission layer of LEDs use the different luminescent materials having different lifetime.

For example, if the lifetime of the blue luminescent material is less than the lifetime of the red or green luminescent material, the size of the blue light-unit electrode may be larger than the size of the red or green light-unit electrode. The described embodiment is only an example and is not limited thereto.

In one embodiment, the arrangement of the light-unit electrodes 11 and the light-emitting regions of the light-emitting diodes (LEDs), which was performed after the packaging process (not shown in figures), may be different in the top view of the display panel 1. For example, the three light-unit electrodes 11 of each pixel 10 are arranged in an array (as shown in FIG. 1). The LEDs with three different colors are arranged in the extension direction D1 in sequence. The described embodiment is only an example and is not limited thereto.

Figure 2:
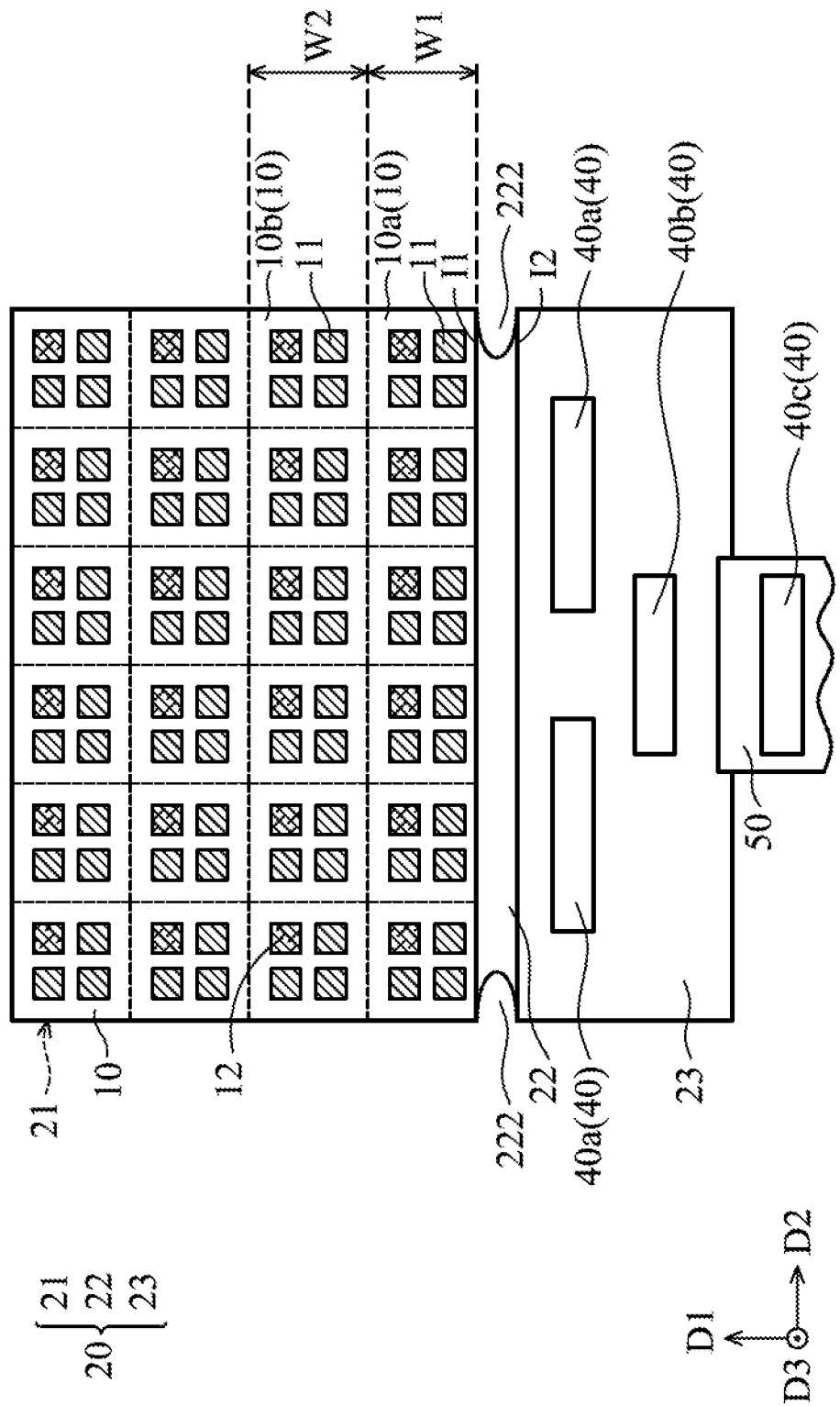
FIG. 2 is a top view of the display panel in accordance with the first embodiment of the present disclosure, wherein the flexible substrate is in an unfolded state.
Figure 3:
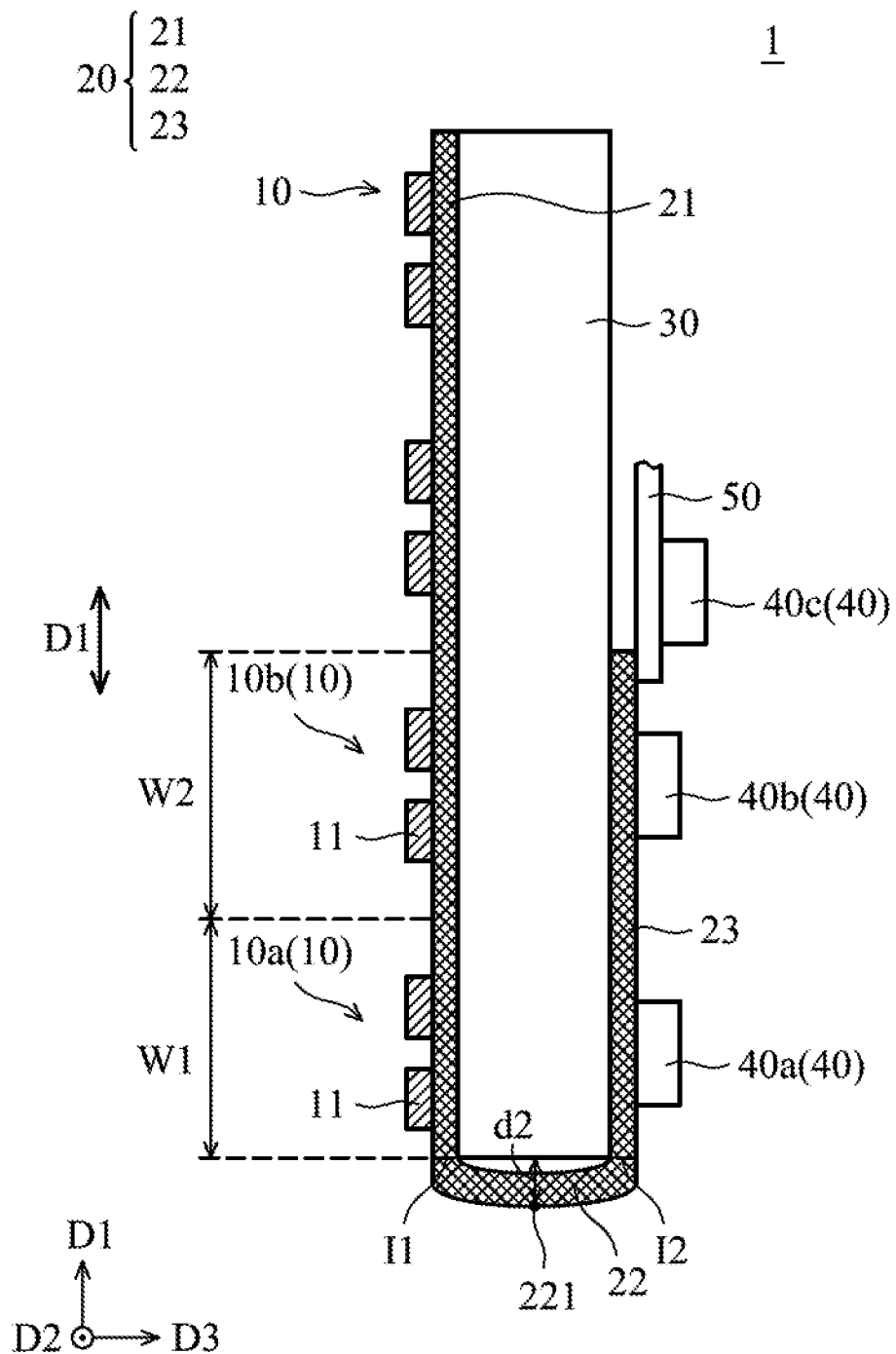
FIG. 3 is a side view of the display panel in accordance with the first embodiment of the present disclosure, wherein the flexible substrate is in a bent state.

FIG. 2 is a top view of the display panel 1 in accordance with the first embodiment of the present disclosure, wherein the flexible substrate 20 is in an unfolded state. FIG. 3 is a side view of the display panel 1 in accordance with the first embodiment of the disclosure, wherein the flexible substrate 20 is in a bent state. The flexible substrate 20 includes a display portion 21, a bent portion 22 and a circuit portion 23.

In FIG. 2, after the circuit portion 23 of the flexible substrate 20 in the unfolded state is bent relative to the display portion 21, the flexible substrate 20 is changed to the bent state as shown in FIG. 3. The flexible substrate 20 includes at least one bent portion 22 and/or at least one circuit portion 23. The number of bent portion 22 and/or circuit portion 23 may be at least two. In the embodiment, the number of bent portions 22 and/or circuit portions 23 is one. The described embodiment is only an example and is not limited thereto.

The display portion 21 may substantially extend in a plane. In the embodiment, the display panel 1 may be rectangular. The pixel 10 may be arranged in an array on the display portion 21. In some embodiments, the display portion 21 may be a polygon or an irregular shape. The polygon may be a triangle, a quadrangle, or a pentagon.

As shown in FIG. 2 and FIG. 3, the edge of a portion of the pixel 10 is a portion of the edge of the display portion 21. Therefore, the display panel 1 of the present disclosure may be a display panel 1 with a narrower frame. When many display panels 1 are spliced into the tiled electronic device A1 as shown in FIG. 1, the display panel 1 can have a narrow frame, which can improve the quality of the integral image displayed by the tiled electronic device A1.

The bent portion 22 is connected to the display portion 21. In the bent state, since the bent portion 22 is formed by bending the flexible substrate 20, the bent portion 22 may be substantially curved. However, basically, the bent portion 22 may substantially extend in a bending direction D3. The bending direction D3 may be perpendicular to the extension direction D1 and the extension direction D2. In other embodiments, the bending direction D3 may be the connection direction of two bending interfaces I1 and I2 from a side view.

The circuit portion 23 is connected to the bent portion 22. In other words, in the bent state, the circuit portion 23 is bent to the back side of the support plate 30, and substantially parallel to the display portion 21. The circuit portion 23 may not necessarily in direct contact with the support plate 30.

In the embodiment, the area of the bent portion 22 is less than the area of the circuit portion 23, and the area of the circuit portion 23 is less than the area of the display portion 21. In some embodiments, the area of the bent portion 22 is 20 times less than the area of the display portion 21. The area of the bent portion 22 is 10 times less than the area of the circuit portion 23.

In the embodiment, a bending interface I1 is between the display portion 21 and the bent portion 22. The bent portion 22 is bent relative to the display portion 21 via the bending interface I1 (the first bending interface). Another bending interface (the second bending interface) I2 is between the bent portion 22 and the circuit portion 23. The bent portion 22 is bent relative to the circuit portion 23 via the another bending interface I2. Moreover, the bending interface I1 may be substantially parallel to the another bending interface I2. In other words, the bending interface I1 and the another bending interface I2 may be substantially parallel to the extension direction D2, or perpendicular to the extension direction D1. In another embodiment, the bending direction D3 may be the connection direction of the bending interface I1 and the another bending interface I2 from a side view.

In the embodiment, two notches 222 are formed on the two opposite sides of the bent portion 22 in the extension direction D2. The notches 222 may be located between the bending interface I1 and the another bending interface I2. In some embodiments, the edge of the notch 222 may be connected to the bending interface I1 and the another bending interface I2. In the embodiment, the notch 222 may make the bent portion 22 bend smoothly relative to the display portion 21 and the circuit portion 23.

In order to make the distances d11, d12, d13 and d14 of the centers of the pixels 10 of each display panel 1 of the present disclosure are the same. In the present disclosure, the pixels 10 includes pixels 10a (second pixels) and another pixel 10b (second pixel). The pixels 10a are disposed on the display portion 21, and connected to the bending interface I1. The pixels 10a may be arranged in the extension direction D2. In the present disclosure, some of the pixels 10 (other than the pixels 10a) may be the another pixels 10b. The another pixels 10b may be electrically connected to the pixels 10a, and they may be distant from the bending interface I1. In other words, the pixels 10a are located between the bending interface I1 and the another pixels 10b.

The width W1 of the pixel 10a is less than the width W2 of the another pixel 10b. In some embodiments, the width W1 of the pixel 10a is about 1.17 mm. The width W2 of the another pixel 10b is about 1.27 mm. In other words, the difference between the width W2 of the another pixel 10b and the width W1 of pixel 10a is about 0.1 mm. In some embodiments, the difference between the width W2 of the another pixel 10b and the width W1 of pixel 10a is in range from 0.05 mm to 0.3 mm. The widths W1 and W2 may be measured in the extension direction D1.

In some embodiments, (as shown in FIG. 2 and FIG. 3), the bent portion 22 is bent, and the bent surface of the bent portion 22 in the bending direction D3 has a top end 221. The top end 221 is close to the center of the bent portion 22. In the extension direction D1, the distance between the top end 221 and the bending interface I1 (or the bending interface I2) plus the width W1 of the pixel 10a may be substantially the same as the width W2 of the another pixel 10b. The described embodiment is only an example and is not limited thereto. In another embodiment, the top end 221 may be closer to the bending interface I1 than the center of the bent portion 22, depending on the designer's design specifications for the frame F1 of the tiled electronic device A1.

As shown in FIGS. 2 and 3, in one embodiment, the display panel 1 further includes a support plate 30, at least one control chips 40 and a flexible cable 50. In the bent state and in the bending direction D3, the support plate 30 is located between the display portion 21 and the circuit portion 23, and connected to the display portion 21 and the circuit portion 23 or at least one portion of the circuit portion 23. In some embodiments, the support plate 30 may be a glass substrate or an opaque substrate, but it is not limited thereto. The support plate 30 is configured to improve the strength of the display panel 1. In some embodiments, the support plate 30 may be separated from the center area of the bent portion 22 in the extension direction D1. That is to say, there is a gap between the central area of the bent portion 22 and the support plate 30 without a direct contact.

At least one control chips 40 are disposed on the circuit portion 23 and/or the flexible cable 50, and are electrically connected to at least one light-unit electrode 11 of the pixel 10. Each of the control chips 40 may be a scan-driving chip, a guard-and-test chip, and/or a data-driving chip. The end of the flexible cable 50 is electrically connected to the circuit portion 23. As shown in FIG. 2 and FIG. 3, the control chips 40a may be scan-driving chips. The control chip 40b may be a guard-and-test chip. The control chip 40c may be disposed on the flexible cable 50, and may be a data-driving chip. In one embodiment, the number of control chips 40a may be greater than the number of control chips 40b or control chips 40c. However, the described embodiment is only an example and is not limited thereto.

In the embodiment, in the extension direction D1, the control chips 40a are close to the bent portion 22, and are arranged in the extension direction D2. The control chip 40a is closer to the bent portion 22 relative to the control chip 40b, and extends in the extension direction D2. The control chip 40c is far from the bent portion 22 relative to the control chip 40b, and extends in the extension direction D2.

Figure 4:
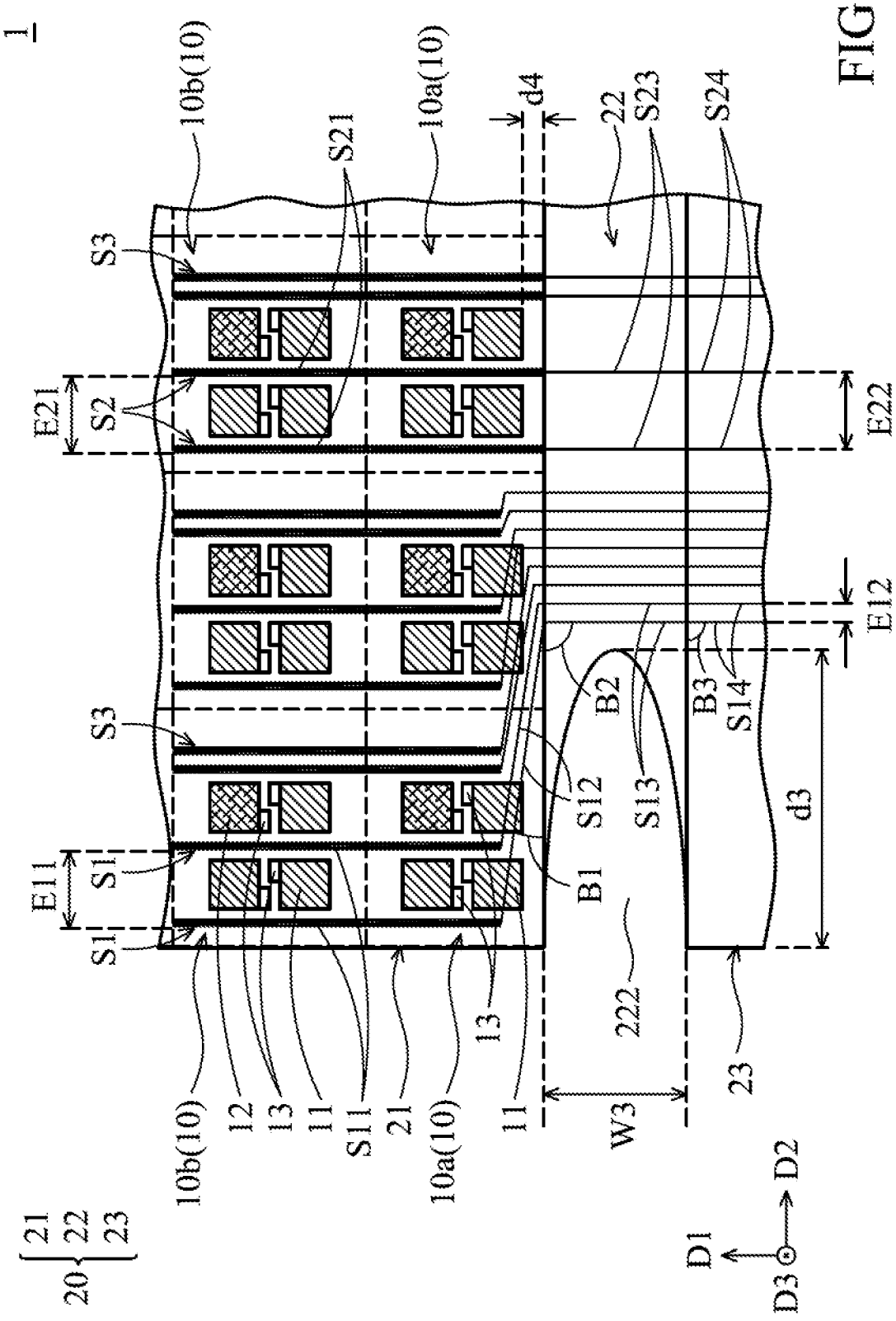
FIG. 4 is a top view of the display panel in accordance with a second embodiment of the present disclosure.
Figure 5:
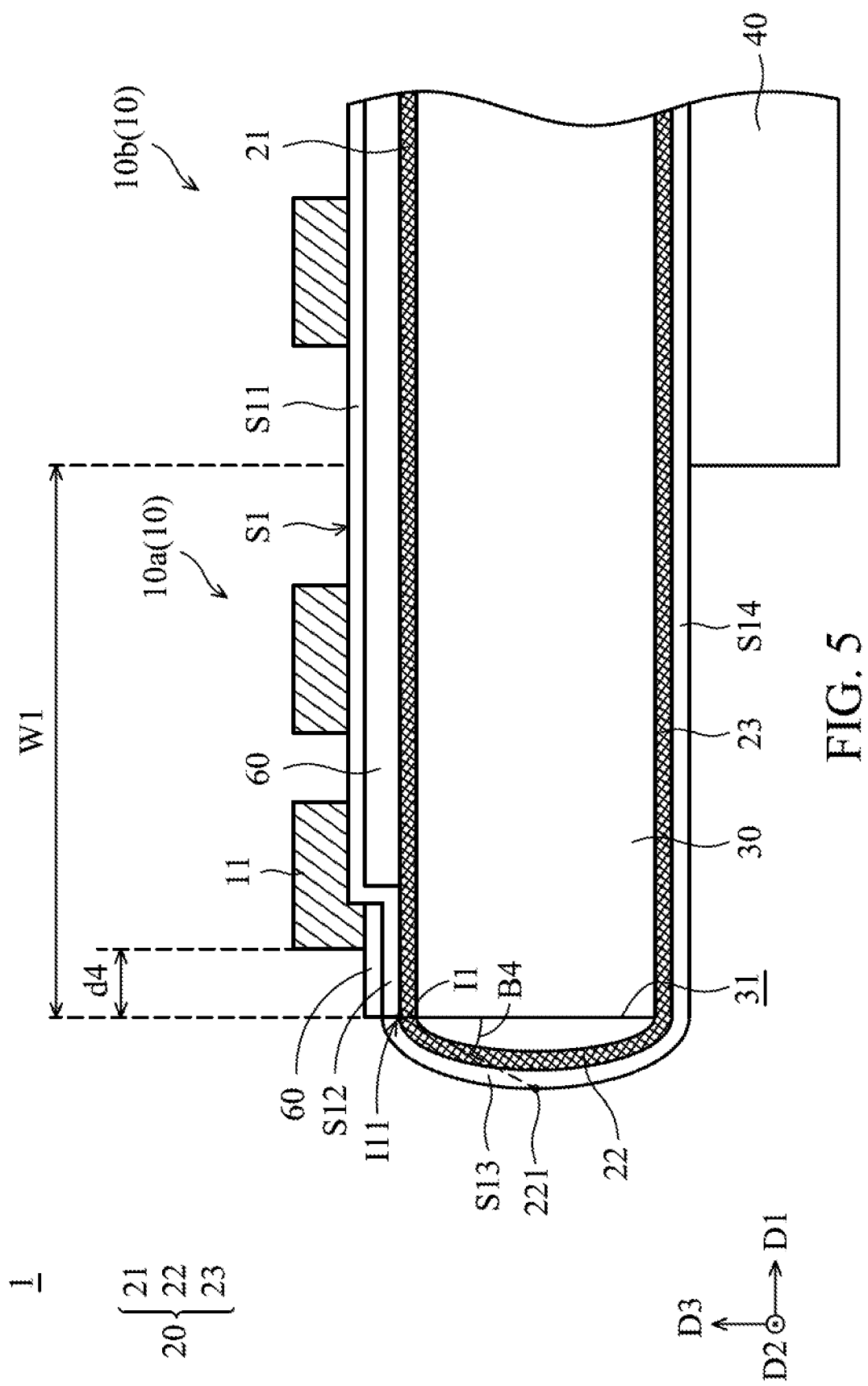
FIG. 5 is a side view of the display panel in accordance with the second embodiment of the present disclosure.

FIG. 4 is a top view of the display panel 1 in accordance with a second embodiment of the present disclosure. FIG. 5 is a side view of the display panel 1 in accordance with the second embodiment of the present disclosure. The distance d3 between the top of the notch 222 and at least end of the notch 222 is greater than or equal to 1.5 mm, and less than or equal to 3 mm. The distance d3 is measured in the extension direction D2. In some embodiments, the distance d3 is 1 to 5 times the width W1 or the width W2 of the pixel 10 ($W1 \leq d3 \leq 5*W1$ or $W2 \leq d3 \leq 5*W2$).

The width W3 of the bent portion 22 is greater than or equal to 0.5 mm, and less than or equal to 2 mm. The width W3 is measured in the extension direction D1 (as shown in FIG. 4). In some embodiments, the distance between the bending interface I1 and the bending interface I2 is substantially equal to the width W3. The width W3 is 1 to 5 times the width W1 of the pixel 10 ($W1 \leq W3 \leq 5*W1$).

Moreover, in the pixel 10a, the distance d4 between the bending interface I1 and the light-unit electrode 11 (adjacent to the bending interface I1) is greater than or equal to 50 μm, and less than or equal to 150 μm.

Each of the pixels 10 (the another pixels 10b and the pixels 10a) is electrically connected to at least one transistor (TFT) 13. The transistors 13 are disposed on the display portion 21, and each transistor 13 is electrically connected to the light-unit electrode 11 or the common electrode 12. The transistor 13 is configured to control at least one or more light-unit electrodes 11 to enable or disable. In one embodiment, the transistor 13 may be an amorphous thin-film transistor, low temperature polysilicon thin-film transistor, a metal-oxide thin-film transistor or a hybrid structure transistor (for example, the low temperature polysilicon transistor is electrically connected to the metal-oxide transistor), but it is not limited thereto.

In the embodiment, the display panel 1 further includes signal wires S1 (first signal wires), signal wires S2 (second signal wires), and signal wires S3 (third signal wires). The signal wires S1, the signal wire S2, and the signal wires S3 are disposed on the flexible substrate 20. Each of the signal wires S1, the signal wires S2, and the signal wires S3 is electrically connected to at least one or more transistors 13 and at least one control chips 40 (as shown in FIG. 2).

The designs of the transistors 13, the signal wire S1, the signal wires S2, and the signal wires S3 according to this embodiments may be applied to the first embodiment.

In the embodiment, the signal wires S1, the signal wires S2 and the signal wires S3 may be data signal wire, gate signal wires, common signal wires, ground signal wires or other types of signal wires. The described embodiment is only an example according to the requirements of the designer, and is not limited thereto. In one embodiment, the signal wires S1 are the signal wires S2 are electrically connected to the control chip 40c. The control chip 40c may transmit data signals to at least one transistors 13 via signal wires S1 and signal wires S2, and signal wires S3 may be electrically connected to ground or common potential signals.

In some embodiments, the display panel 1 further includes compensation-signal wires and scan-signal wires (not shown in figures) disposed on the flexible substrate 20. The compensation-signal wires and the scan-signal wires may be electrically connected to at least one control chip 40c (as shown in FIG. 2, one control chip 40c are shown in FIG. 2, but it is not limited thereto). In the embodiment, the scan-signal wire may be electrically connected to the control chips 40a. The control chips 40a may be transmit scan signals to the transistor 13 via the scan-signal wire. The transistors 13 may control at least one or more light-unit electrodes 11 to be enabled or disabled according to data signals and scan signals.

In the embodiment, the signal wires S1 are closer to the notch 222 and the edge of the display portion 21 extending in the extension direction D1 than the signal wires S2. Each signal wire S1 includes a first segment S11, an inclined segment S12, a second segment S13, and a control segment S14. The first segment S11 is disposed on the display portion 21, and selectively electrically connected to the pixels 10 (the another pixels 10b and the pixels 10a) arranged in the extension direction D1.

In the embodiment, two adjacent first segments S11 extend in the extension direction D1, and substantially parallel to each other. Each first segment S11 is electrically connected to one transistor 13. In one pixel 10, the pitch (first pitch) E11 of two adjacent first segments S11 is greater than or equal to 200 μm, and less than or equal to 400 μm. In the embodiment, the pitch E11 of two adjacent first segments S11 is about 300 μm. The pitch E11 may be measured in the extension direction D2. In some embodiments, the first segment S11 includes many metal layers overlaid on the display portion 21 in sequence, such as a molybdenum layer, an aluminum layer, and a molybdenum layer.

At least a portion of the inclined segment S12 is disposed on the display portion 21, and connected to the first segment S11. The inclined segment S12 is inclined relative to the first segment S11 and the second segment S13, and adjacent to the bending interface I1 and the notch 222 in the extension direction D1. The angle B1 between the inclined segment S12 and the bending interface I1 is about 0 degrees to 45 degrees. Moreover, the two adjacent inclined segments S12 may be linearly extended, and substantially parallel to each other.

In the embodiment, the length of each inclined segment S12 may be calculated by the length of the inclined segment S12 projected to the extension direction D2. The projection lengths of two adjacent inclined segments S12 are different. In another embodiment, in the top view of the flexible substrate 20, the inclined segment S12 is overlapped at least portion of the light-unit electrode 11, the common electrode 12 or the transistor 13. Different inclined segments S12 may have different overlapping areas, and different overlapping areas of different positions may be adjusted according to electrical requirements to reduce the influence of possible parasitic capacitance.

As shown in FIG. 5, a portion of the inclined segment S12 is located between the display portion 21 and the light-unit electrode 11 of the pixel 10a in the bending direction D3. In the embodiment, the display panel 1 further includes a dielectric layer 60, disposed on the display portion 21. There may be other layers between the dielectric layer 60 and the flexible substrate 20, or between the inclined segment S12 and the flexible substrate 20.

The light-unit electrode 11 and the first segment S11 are disposed on the dielectric layer 60. The inclined segment S12 may be disposed on the dielectric layer 60. The dielectric layer 60 is optionally excluded, and the inclined segment S12 is disposed on the display portion 21. In one embodiment, the materials of the dielectric layer 60 comprise at least organic or inorganic materials. The organic materials may be SiOx, SiNx, or SiOxNy, and the inorganic materials may be PFA. The described embodiment is only an example and is not limited thereto. The stack structure is only an example and not limited thereto. For example, from a top view (such as in the bending direction D3), the stack sequence of the light-unit electrode 11, the first segment S11, the dielectric layer 60, and the inclined segment S12 may be changed according to requirements.

The second segment S13 is disposed on the bent portion 22, and connected to the inclined segment S12. The control segment S14 is disposed on the circuit portion 23 (when the flexible substrate is in an unfolded state), and connected to the second segment S13 and electrically connected to control chip 40. In the bent state, the angle B2 between the second segment S13 and the bending interface I1 is about 80 degrees to 135 degrees (please refer to FIG. 4 at the same time). When the bent portion 22 is bent in the bending direction D3, an arc angle B4 is between the bent portion 22 and the edge surface 31 of the support plate 30, or the bent portion 22 is substantially perpendicular to the display portion 21 or the circuit portion 23.

The arc angle B4 may be greater than or equal to 2 degrees, and less than or equal to 85 degrees. In one embodiment, the arc angle B4 may be greater than or equal to 2 degrees, and less than or equal to 45 degrees. In another embodiment, the arc angle B4 is between a connection line and an extension line, wherein the connection line is a line connecting the top end 221 of the bent portion 22, which is bent in the bending direction D3, and a bottom end I11 of the bending line I1 in the bending direction D3. Moreover, the extension line is a line of the extension of the edge surface 31 of the support plate 30 in the bending direction D3.

In another embodiment, the edge surface 31 of the support plate 30 may be a rough surface, so the edge surface 31 of the support plate 30 may be an average surface of the rough surface. In this disclosure, the rough surface is averaged from a highest point and a lowest point of the extension direction D1. In the embodiment, two adjacent second segments S13 are substantially parallel to each other, and may extend to the display portion 21 to connect with the inclined segment S12.

In the embodiment, as shown in FIG. 4, the pitch E12 between two adjacent second segments S13 is greater than or equal to 10 μm, and less than or equal to 40 μm. In the embodiment, the pitch (second pitch) E12 of two adjacent second segments S13 is about 25 μm. The pitch E12 may be measured in the extension direction D2. In other words, in one pixel 10, the pitch of two adjacent first segments S11 is greater than the pitch of two adjacent second segments S13. Moreover, in one pixel 10, the pitch of two adjacent first segments S11 may be greater than the pitch of two adjacent inclined segments S12.

In the embodiment, the signal wire S2 is far from the edge of the display portion 21 than the signal wire S1 in the extension direction D2. Each signal wire S2 includes a first segment S21, a second segment S23, and a control segment S24. The first segment S21 is disposed on the display portion 21, and electrically connected to the pixels 10 (the another pixels 10b and the pixels 10a) in the extension direction D1. In the embodiment, the pixels 10a are disposed on the display portion 21, and adjacent to the bending interface I1. The pixels 10b is far from the edge of the display portion 21 than the pixels 10a in the extension direction D1.

In the embodiment, the two adjacent first segments S21 extends in the extension direction D1, and substantially parallel to each other. Each first segment S21 is electrically connected to at least one transistor 13. In one pixel 10, the pitch E21 of two adjacent first segments S21 is in a range from 200 μm to 400 μm. In the embodiment, the pitch E21 of two adjacent first segments S21 is about 300 μm. The pitch E21 may be measured in the extension direction D2. In some embodiments, the first segment S21 comprises a molybdenum layer, an aluminum layer and a molybdenum layer disposed on the display portion 21 in sequence. Moreover, the first segment S21 may be substantially parallel to the first segment S11, and the pitch E21 is substantially equal to the pitch E11.

The second segment S23 is disposed on the bent portion 22, and connected to the first segment S21. The control segment S24 is disposed on the circuit portion 23, connected to the second segment S23 and electrically connected to the control chips 40. In the embodiment, two adjacent second segments S23 are substantially parallel to each other, and substantially parallel to the second segment S13. In the embodiment, the pitch E22 between two adjacent second segments S23 is between about 200 μm and 400 μm. In the embodiment, the pitch E22 of two adjacent first segments S23 is about 300 μm. The pitch E22 may be substantially equal to the pitch E21 and the pitch E11. The pitch E22 may be measured in the extension direction D2.

Figure 6:
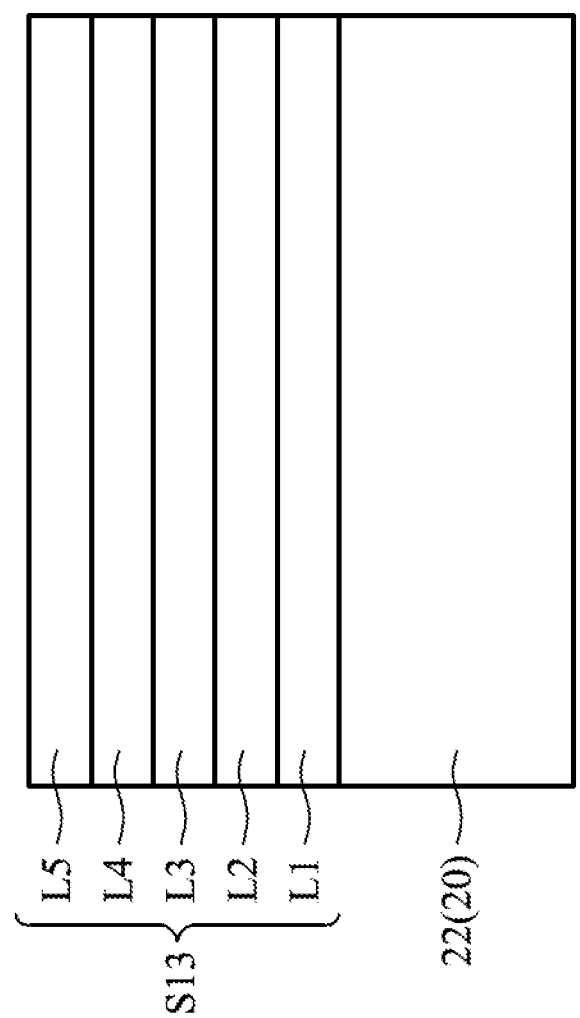
FIG. 6 is a side view of the second segment and the bent portion in accordance with some embodiments of the present disclosure.

FIG. 6 is a side view of the second segment S13 and the bent portion 22 in accordance with some embodiments of the present disclosure. The second segment S13 includes a first insulation layer L1, a first metal layer L2, a second metal layer L3, a third metal layer L4, and a second insulation layer L5. The first insulation layer L1 is disposed on the bent portion 22. The first metal layer L2 is disposed on the first insulation layer L1, and comprises at least one titanium material. The second metal layer L3 is disposed on the first metal layer L2, and comprises at least one aluminum material. The third metal layer L4 is disposed on the second metal layer L3, and comprises at least one titanium material. The second insulation layer L5 is disposed on the third metal layer L4.

In some embodiments, the second segment S23 of signal wire S2 may have the same structure and material as the second segment S13 of signal wire S1.

The signal wires S3 may be disposed on the display portion 21, the bent portion 22 and the circuit portion 23. The signal wires S3 on the display portion 21 may be electrically connected to the common electrodes 12 of the pixels 10 arranged in the extension direction D1. In the embodiment, the structure of the signal wires S3 may be designed according to the signal wires S1 and the signal wires S2. The signal wires S3 may extend substantially parallel to the first segments S11, the second segments S13, the first segments S21 and the second segments S23.

Figure 7B:
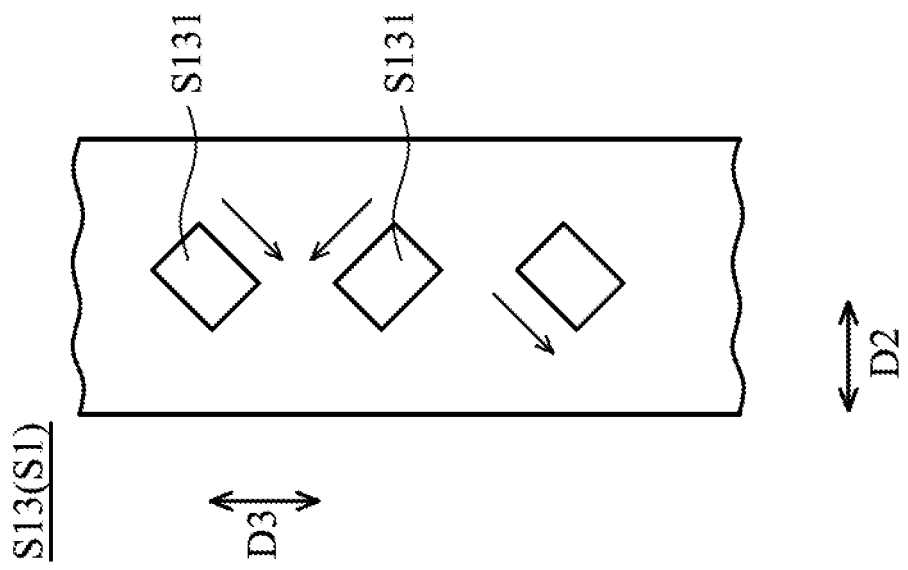
FIG. 7B is a top view of the second segment of the signal wire in accordance with the second embodiment of the disclosure.
Figure 7A:
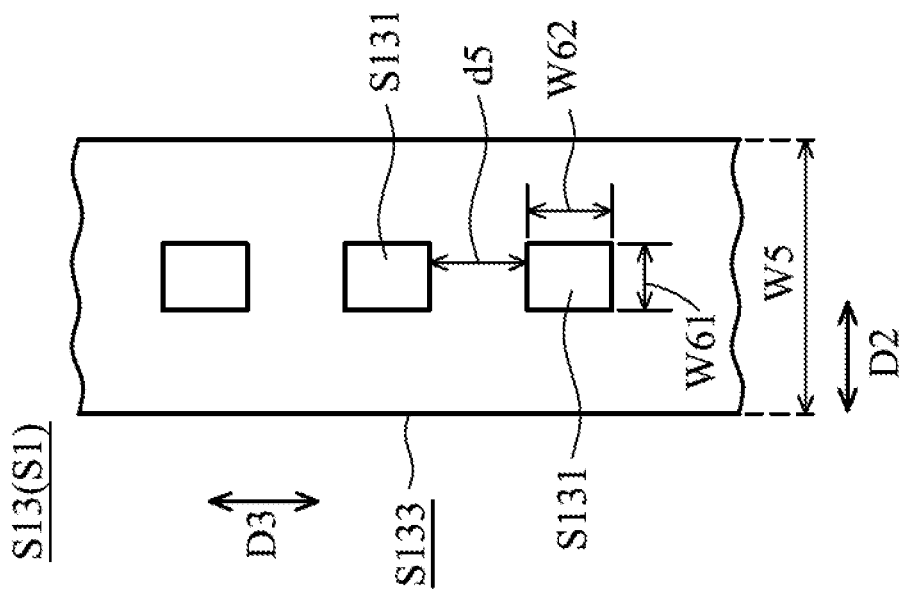
FIG. 7A is a top view of the second segment of the signal wire in accordance with the first embodiment of the present disclosure.

FIG. 7A is a top view of the second segment S13 of the signal wire S1 in accordance with the first embodiment of the present disclosure. As shown in FIG. 2, when the flexible substrate 20 is in an unfolded state, the second segment S13 may substantially extend in the extension direction D1. As shown in FIG. 3 and FIG. 7A, when the flexible substrate 20 is in bent state, at least portion of the second segment S13 may substantially extend in the bending direction D3.

The width W5 of the second segment S13 is greater than or equal to 10 and less than or equal to 15 µm. In the embodiment, the width W5 of the second segment S13 is about 12 µm. The width W5 is measured in the extension direction D2.

In the embodiment, at least portion of the second segment S13 may substantially extend in the bending direction D3. The signal wire S1 further includes through holes S131. The through holes S131 may be substantially and separately arranged in the bending direction D3.

As shown in FIG. 7A, in the embodiment, the through hole S131 may be rectangular, but it is not limited thereto. In some embodiments, the through hole S131 may be a circle, oval, square, or an irregular shape. In some embodiments, the through hole S131 may be triangular, quadrilateral, pentagonal, or hexagonal.

In the embodiment, the distances between the geometric centers of the through holes S131 and the edges S133 of the second segments S13 may be substantially the same. The distance d5 between two adjacent through holes S131 may be greater than or equal to and less than or equal to 8 µm. In the embodiment, the distance d5 between two adjacent through holes S131 is about 6 µm. The width W61 of the through hole S131 may be greater than or equal to 2 µm, and less than or equal to 6 µm. The length W62 of the through holes S131 may be greater than or equal to 3 µm, and less than or equal to 12 µm. The width W61 may be measured in the extension direction D2. The width W62 may be measured in the bending direction D3.

FIG. 7B is a top view of the second segment S13 of the signal wire S1 in accordance with the second embodiment of the disclosure. In the embodiment, the orientations of the through holes S131 may be different. In the embodiment, each through hole S131 has a first orientation and a second orientation. The angle between the extension direction of the through hole S131 in the first orientation and the bending direction D3 is about positive 45 degrees. The angle between the extension direction of the through hole S131 in the second orientation and the bending direction D3 is about negative 45 degrees. The through hole S131 in the first orientation and the through hole S131 in the second orientation may be substantially arranged in an alternate arrangement in the bending direction D3. However, the described embodiment is only an example and is not limited thereto. The angle can be changed according to the requirement of the user.

FIG. 7C is a top view of the second segment S13 of the signal wire S1 in accordance with a third embodiment of the present disclosure. In the embodiment, the second segment S13 may be a wavy structure. The through holes (first through holes and the second through holes) S131 and S132 may be substantially arranged in a staggered arrangement in the bending direction D3.

In the embodiment, in the extension direction D2, the distances between the through holes S131 and the edges S133 may be substantially the same. The distances between the through holes S132 and the edges S133 may be the same. Moreover, the distances between the through holes S131 and the edges S133 are less than the distances between the through holes S132 and the edges S133.

Each through hole S131 may be separated from at least one adjacent through hole S132 in the bending direction D3. The distance d5 between the through hole S131 and the through hole S132 in the bending direction D3 may be greater than or equal to 2 and less than or equal to 5 µm. In the embodiment, the through holes S131 and S132 are irregularly shaped. The shapes of the through holes S131 and the through holes S132 are substantially the same in a bending direction D3. In another embodiment, the shapes of the through holes S131 and the through holes S132 are substantially the same, that means the absolute difference of the areas of the through holes S131 and S132 are less than or equal to 10%.

FIG. 7D is a top view of the second segment S13 of the signal wire S1 in accordance with a fourth embodiment of the present disclosure. In the embodiment, the through holes S131 and S132 are substantially arranged in a staggered arrangement in the bending direction D3. The through holes S131 and S132 are formed on two opposite edges S133 of the second segment S13.

In the embodiment, the through holes S131 and S132 may be semicircular or any other shape. The described embodiment is only an example and is not limited thereto. The diameters W63 of the through holes S131 and S132 are greater than or equal to 2 µm, and less than or equal to 5 µm. In the embodiment, the diameters W63 of the through holes S131 and S132 are about 3 µm.

The through holes S131 are separated from the through holes S132 in the bending direction D3. The distance d5 between the through hole S131 and the through hole S132 in the bending direction D3 may be greater than or equal to 2 µm, and less than or equal to 5 µm. The distance d6 between two adjacent through holes S131 may be greater than or equal to 5 µm, and less than or equal to 8 µm. The distance d7 between two adjacent through holes S132 is greater than or equal to 5 µm, and less than or equal to 8 µm. In the embodiment, the distance d6 is substantially the same as distance d7. In some embodiments, the distance d6 may be substantially different than the distance d7.

Figure 7F:
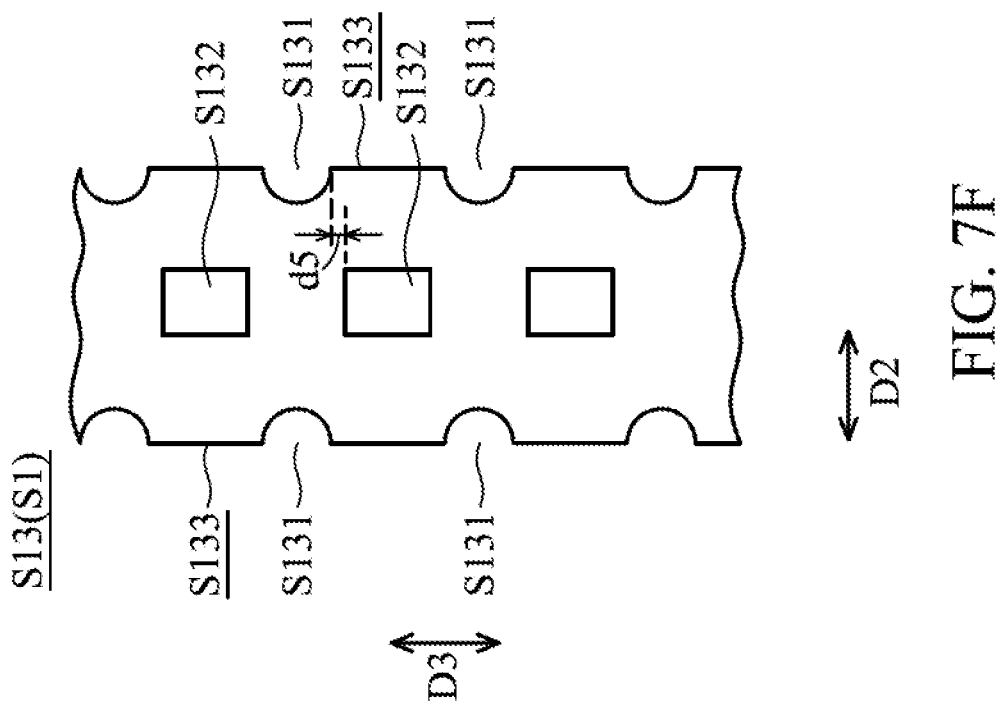
FIG. 7F is a top view of the second segment of the signal wire in accordance with a sixth embodiment of the present disclosure.
Figure 7E:
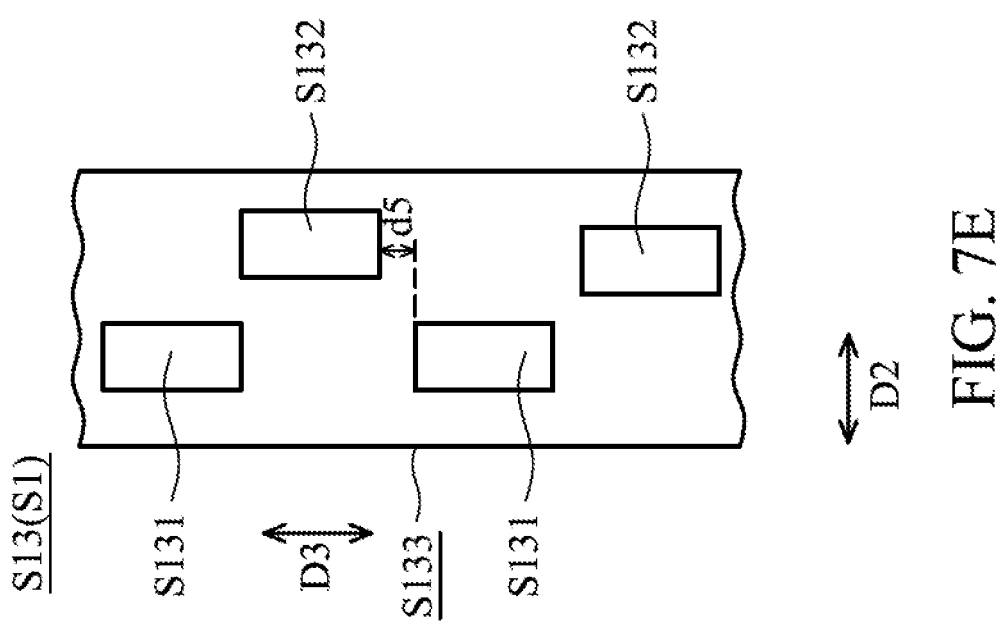
FIG. 7E is a top view of the second segment of the signal wire in accordance with a fifth embodiment of the present disclosure.

FIG. 7E is a top view of the second segment S13 of the signal wire S1 in accordance with a fifth embodiment of the present disclosure. The second segment S13 may extend substantially in bending direction D3. The through holes S131 and S132 may substantially arranged in a staggered arrangement in the bending direction D3.

In the embodiment, the through holes S131 and S132 are rectangle. The through hole S131 is separated from the through hole S132 in the bending direction D3. The distance d5 between the through holes S131 and the through holes S132 in the bending direction D3 may be greater than or equal to 2 μm, and less than or equal to 5 μm. In the embodiment, in the extension direction D2, the distances between the through holes S131 and the edges S133 are substantially the same. Moreover, the distances between the through holes S132 and the edges S133 are substantially the same. Moreover, the distance between one of the through holes S131 and the edge S133 may be greater than the distance between one of the through holes S132 and the edge S133. In one embodiment, the distance between one of the through holes S131 and the edge S133 may be less than the distance between one of the through holes S132 and the edge S133 (not shown in FIG. 7E).

FIG. 7F is a top view of the second segment S13 of the signal wire S1 in accordance with a sixth embodiment of the present disclosure. In the embodiment, the through holes S131 may be semicircular, and the through hole S132 may be rectangular, but it is not limited thereto. The shape of the through holes S131 is different from the through holes S132. The second segment S13 may extend substantially in the bending direction D3. The through holes S131 and S132 may be substantially arranged in a staggered arrangement in the bending direction D3.

The through holes S131 are formed on two opposite edges S133 of the second segment S13. The through holes S132 are located between the opposite edges S133 of the second segment S13. The through holes S131 are separated from the through holes S132 in the bending direction D3. The distance d5 between the through hole S131 and the through hole S132 in the bending direction D3 is greater than or equal to 1 μm, and less than or equal to 5 μm.

Figure 7G:
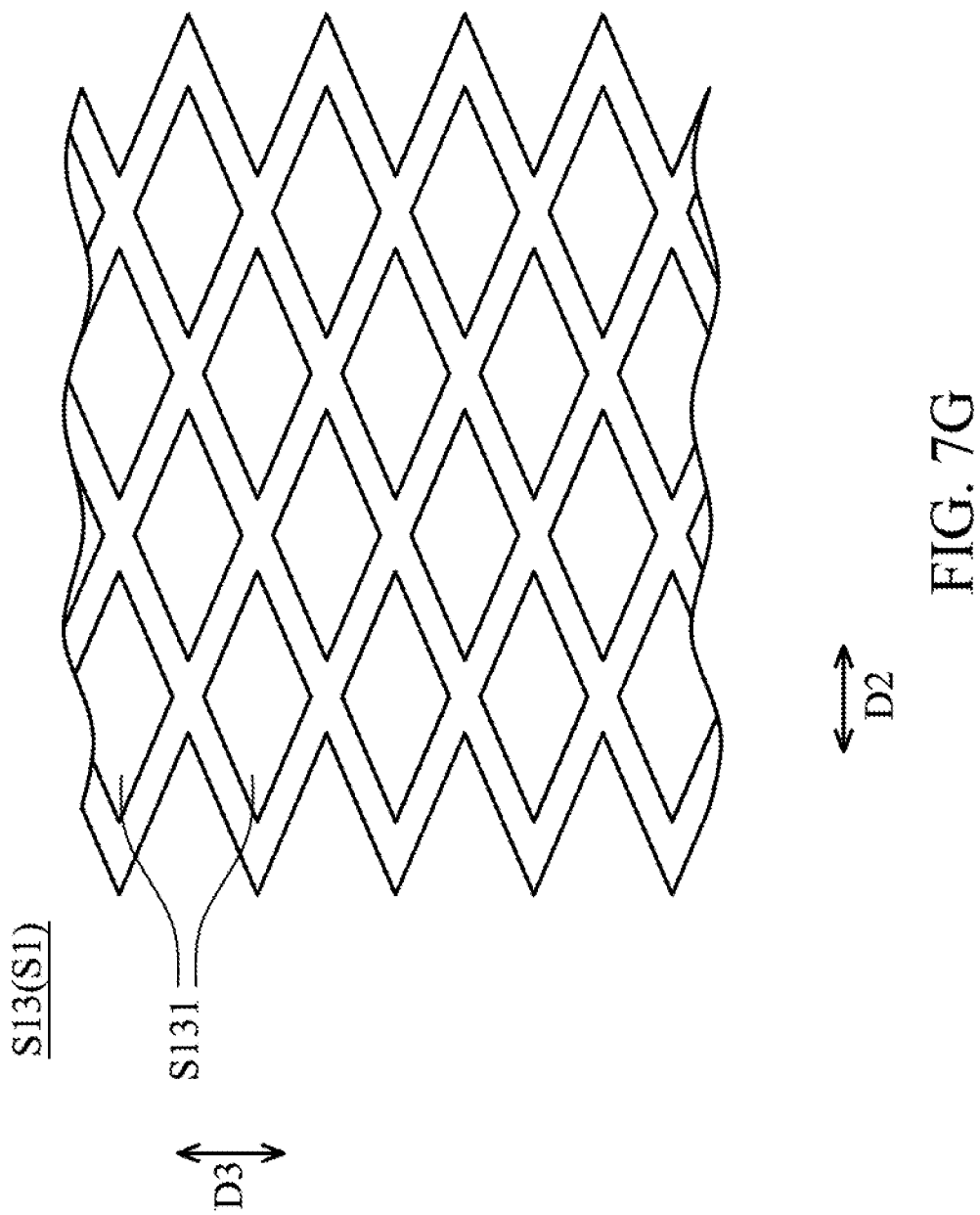
FIG. 7G is a top view of the second segment of the signal wire in accordance with a seventh embodiment of the present disclosure.

FIG. 7G is a top view of the second segment S13 of the signal wire S1 in accordance with a seventh embodiment of the present disclosure. In the embodiment, the second segment S13 may extend substantially in the bending direction D3. The second segment S13 may be a grid structure. The through holes S131 are arranged on the second segment S13 in an array. In the embodiment, the shape of the through holes S131 may be a rhombus, a square, a circle, a rectangle, a polygon or any other shape. The shape of the through holes S131 may be modified according to the user's requirements. The shape of the through holes S131 may be accepted as long as the second segment S13 is bent along the bending direction D3, and the risk of disconnection can be mitigated and the advantage of being easy to bend.

The disclosed features may be combined, modified, or replaced in any suitable manner in one or more disclosed embodiments, but are not limited to any particular embodiments.

In conclusion, the display panel of the present disclosure may utilize a bent flexible substrate to make the elements, such as the control chips, to be disposed on the back side of the display panel, thereby reducing the frame area of the display panel. Moreover, the notch is formed by the bent portion of the flexible substrate so that the flexible substrate can be smoothly bent. By changing the size of the pixel and the extension path of the signal wire, the distances between the centers of any two adjacent pixels of adjacent display panels are the same, thereby improving the quality of the image displayed by the display device.

While the present disclosure has been described by way of example and in terms of preferred embodiment, it should be understood that the present disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a display panel, comprising:
a flexible substrate which comprises a display portion and a bent portion connected to the display portion;
two adjacent data signal wires disposed on the display portion and the bent portion;
wherein each of the two adjacent data signal wires has a first segment disposed on the display portion and a second segment disposed on the bent portion, and
wherein a first distance which is between the two first segments and in a direction perpendicular to the two first segments is different from a second distance which is between the two second segments and in a direction perpendicular to the two second segments.

2. The electronic device as claimed in claim 1, wherein the display panel further comprises a signal line which comprises a plurality of through holes.

3. The electronic device as claimed in claim 2, wherein a distance between two adjacent through holes is greater than or equal to 2 μm and less than or equal to 5 μm.

4. The electronic device as claimed in claim 1, wherein the second distance is less than the first distance.

5. The electronic device as claimed in claim 1, wherein an area of the bent portion is less than an area of the display portion.

6. The electronic device as claimed in claim 1, wherein the flexible substrate further comprises a circuit portion connected to the bent portion.

* * * * *